United States Patent
Kurapov et al.

(10) Patent No.: US 10,636,635 B2
(45) Date of Patent: Apr. 28, 2020

(54) TARGET, ADAPTED TO AN INDIRECT COOLING DEVICE, HAVING A COOLING PLATE

(71) Applicant: Oerlikon Surface Solutions AG, Trübbach, Trübbach (CH)

(72) Inventors: Denis Kurapov, Walenstadt (CH); Siegfried Krassnitzer, Feldkirch (AT)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 167 days.

(21) Appl. No.: 14/902,577

(22) PCT Filed: Jun. 30, 2014

(86) PCT No.: PCT/EP2014/001782
§ 371 (c)(1),
(2) Date: Jan. 3, 2016

(87) PCT Pub. No.: WO2015/000577
PCT Pub. Date: Jan. 8, 2015

(65) Prior Publication Data
US 2016/0172166 A1    Jun. 16, 2016

(30) Foreign Application Priority Data

Jul. 3, 2013    (DE) .................. 10 2013 011 074

(51) Int. Cl.
*H01J 37/34*    (2006.01)
*C23C 14/34*    (2006.01)

(52) U.S. Cl.
CPC ...... *H01J 37/3497* (2013.01); *C23C 14/3407* (2013.01); *H01J 37/3417* (2013.01); *H01J 37/3423* (2013.01); *H01J 37/3435* (2013.01)

(58) Field of Classification Search
CPC .............. H01J 37/3497; H01J 37/3414; H01J 37/3417; H01J 37/3435; H01J 37/3423; C23C 14/3407; C23C 14/54; C09J 7/026
(Continued)

(56) References Cited

U.S. PATENT DOCUMENTS 4,569,745 A * 2/1986 Nagashima ......... C23C 14/3407
204/192.15
5,082,595 A * 1/1992 Glackin ................. C09J 201/00
252/511

(Continued)

FOREIGN PATENT DOCUMENTS

CN    201778106 U    3/2011
EP    0456891 A1    11/1991
(Continued)

OTHER PUBLICATIONS

"Hochwärmeleitende Karbonfolien Serie KU-CB1200," Internet Citation, Nov. 30, 2010, p. 1, XP002697228, URL:http://heatmanagement.com/local/media/hmproducts/ku-cb1200-50/ku-cb1200_datenblatt.pdf.
(Continued)

*Primary Examiner* — Michael A Band

(57) ABSTRACT

A device for cooling a target, having a component that includes a cooling duct and having an additional thermally conductive plate that is detachably fastened to the cooling side of the component, the cooling side being the side on which the cooling duct exerts its cooling action, characterized in that between the additional thermally conductive plate and the cooling side of the component, a first self-adhesive carbon film is provided, which is extensively and self-adhesively glued to the one side of the additional thermally conductive plate that faces the cooling side.

9 Claims, 4 Drawing Sheets

(58) Field of Classification Search
USPC .......................... 204/298.09, 298.11, 192.15
See application file for complete search history.

(56) References Cited

U.S. PATENT DOCUMENTS

| | | | | |
|---|---|---|---|---|
| 5,985,115 A * | 11/1999 | Hartsough | .......... | H01J 37/3408 |
| | | | | 204/298.09 |
| 6,358,382 B1 * | 3/2002 | Stucki | ................ | C23C 14/3407 |
| | | | | 204/298.11 |
| 2006/0163059 A1 * | 7/2006 | Leitner | ............... | C23C 14/3407 |
| | | | | 204/298.09 |

FOREIGN PATENT DOCUMENTS

| | | | | |
|---|---|---|---|---|
| EP | 0512456 A1 | | 11/1992 | |
| EP | 1752556 A1 | | 2/2007 | |
| JP | 2000068234 A | | 3/2000 | |
| JP | 2001-164361 | * | 6/2001 | ............. C23C 14/34 |
| JP | 2001164361 A | | 6/2001 | |
| JP | 2008521992 A | | 6/2008 | |
| JP | 2010062018 A | * | 3/2010 | |
| JP | 2012510546 A | | 5/2012 | |
| WO | 9807565 A1 | | 2/1998 | |
| WO | WO-9807565 A1 | * | 2/1998 | ......... C23C 14/3407 |

OTHER PUBLICATIONS

Dang Genmao, Introduction to Electronic Precision Machinery, May 31, 1995, p. 159, Press of Xi'An University of Electronic Science and Technology [the relevance of this reference is characterized on p. 5 of the English translation of the Chinese Office Action dated Aug. 8, 2017, which is included with this filing].

* cited by examiner

Fig. 3
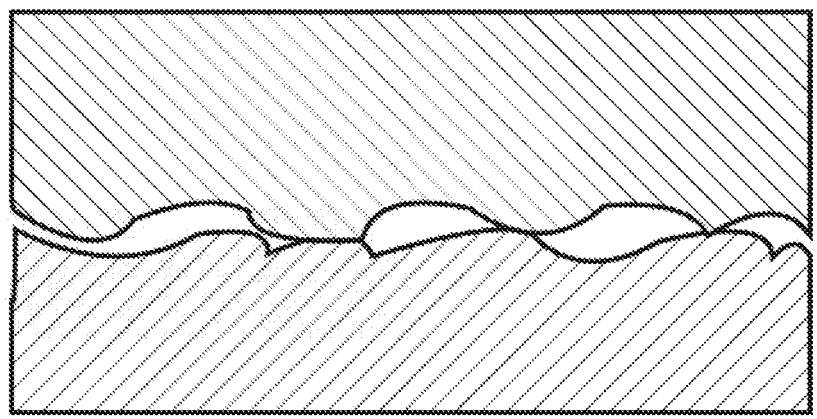
Fig. 4a
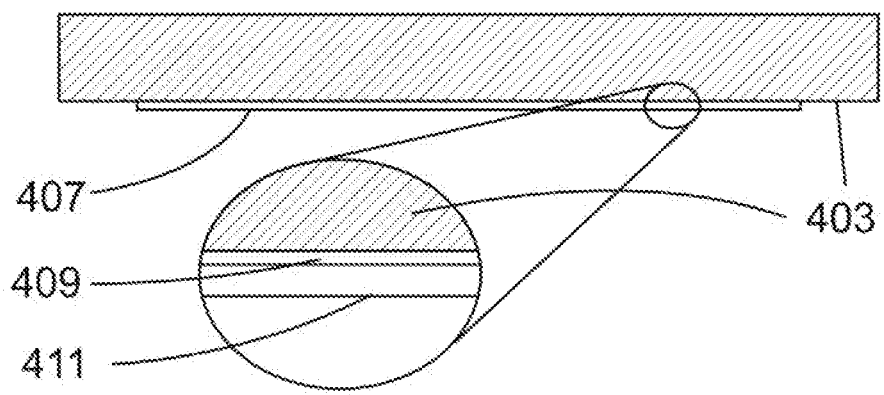
Fig. 4

TARGET, ADAPTED TO AN INDIRECT COOLING DEVICE, HAVING A COOLING PLATE

FIELD OF THE INVENTION

The present invention relates to a target whose surface is used as a material source in PVD processes, particularly under vacuum conditions. The invention particularly relates to targets of this kind that are used for sputtering (i.e. the PVD process referred to as "Zerstäuben" in German). In use, a target of this kind is usually held by a source holder in which means for cooling it are provided. The invention especially relates to a coating source that includes such a target.

BACKGROUND OF THE INVENTION

In sputtering, the surface of a target is bombarded with ions under vacuum conditions. The bombardment blasts material from the target surface, which can be deposited onto substrates provided for this purpose that are placed in the field of view of the target surface. The ions required for this are provided by means of plasma that is built up over the target surface. By applying a negative voltage to the target, the ions are accelerated toward it. The more ions flow per unit time, the higher the coating rates are achieved. The higher the voltage that is applied to the target, the higher the impact velocity of the ions against the target surface is, and the higher the energy of the sputtered material that is blasted from the target. A higher power input is therefore desirable. Dependencies between the degree of ionization of the sputtered material and the power density are also known to exist. These effects are used in the HIPIMS process.

The middle power densities that are applied to such a sputtering target are generally in the range from 5 W/cm$^2$ to 30 W/cm$^2$.

Sputtering, however, is a PVD coating method that is not very energy efficient. This means that a large part of the energy provided in the target is converted into heat and the target heats up. This heat must be carried off by means of a cooling process. There are various approaches to achieve this in the prior art, which will be briefly outlined below.

a) Directly Cooled Target

With a directly cooled target 1, as schematically depicted in FIG. 1, the power that has been converted to heat on the target surface 3 is conveyed in the target material 5 by thermal conduction to the target back 7. The cooling fluid 11 flowing in a water duct 9 can carry off the flow of heat in accordance with its thermal capacity and the flow conditions. There is a very good thermal contact between the target back 7 and the cooling fluid 11. In this case, however, it is necessary to fasten the target to the base body 15, e.g. by means of screws 13. In addition, a seal 17 must be provided, which seals the vacuum off from the cooling fluid 11, for example water. Supply lines 6 are also outlined depicted in FIG. 1. Otherwise, the drawing is only a schematic depiction. Other components, for example for vacuum production, insulation, and the supply and removal of the cooling fluid are known to experts and are therefore not shown here.

This directly cooled target is in fact attractive due to its very good cooling capacity, but has significant disadvantages due to presence of the coolant/vacuum seal and the necessary breaking of the water/target bond when changing targets. There is thus the danger, for example, of generating cooling fluid leaks. This danger is particularly high when frequent changes of the target material are required.

b) Indirectly Cooled Target

With an indirectly cooled target, as shown in FIG. 2, the back 203 of the target 201 is fastened to a source holder 205 (e.g. by screws or clamps) and an intrinsically closed cooling plate 207 is integrated into the source holder 205. For example, the cooling plate 207 includes a cooling duct 209 through which coolant flows, whose moving fluid carries off the heat.

In this case, the cooling fluid duct is bordered by a solid, stationary cover. For the sake of cooling and electrical contact, the target is fastened to this cover, for example with screws at the circumference or possibly in the middle of the target. This method leads, among other things, to two problems:

The heat transmission is produced through the surface of the target back and the surface of the cooling plate. Without particular measures, these two surfaces constitute a boundary surface that deviates sharply from that of an ideal, smooth contact pair. Such a situation is shown in FIG. 3. The heat transmission in this case is sharply reduced and turns out to be pressure dependent. Contact pressure, however, can only be introduced by means of the fastening screws, for example; in other words, the heat transmission can only be improved locally.

This situation can be improved by providing a contact film between the two surfaces. This film can, for example, be made of indium, tin, or graphite. Due to their ductility, these films can compensate for irregularities between the target back and the surface of the cooling plate. In addition, the contact pressure can be exerted more evenly over the area.

A disadvantage of this method is that it is awkward and difficult to mount a contact film, particularly with vertically mounted targets. This is particularly relevant when it is necessary to change the target materials frequently. In the case of graphite films, the lateral thermal conductivity is in fact good, but the transverse thermal conductivity is poor. Graphite films must therefore on the one hand be thin so that their low transverse thermal conductivities do not hinder the cooling process. On the other hand, a certain film thickness is necessary in order to avoid damage to the film during installation. For this reason, graphite films with a thickness of no less than 0.5 mm are used.

There is thus a need for an improved cooling device for targets, which in particular improves the changing of the target material as compared to the devices known from the prior art.

SUMMARY OF THE INVENTION

The invention is based on a modification of the above-outlined indirect cooling device. According to the invention, the object is attained in that a self-adhesive carbon film is attached to the back of the target body, firmly bonded to the target body. The film can be glued uniformly and without gaps to the back of the target body before the target body is mounted. This ensures a very good thermal contact between the back of the target body and the carbon film. The target body can then be easily mounted to the source holder. The carbon film attached to the target then performs the function of a contact film between the surface of the cooling plate and the back of the target body.

The use of such a self-adhesive carbon film is not customary in the field of vacuum technology. Because the glues used for producing the self-adhesive carbon film experience substantial outgassing under vacuum conditions and thus have a negative effect on the vacuum and because the corresponding volatile components result in the contamination of the substrates to be treated under vacuum, such substances are not used.

By contrast, the inventors have discovered to their great surprise that the self-adhesive films used as described above do not soften from the above-delineated disadvantages in any perceptible way. An explanation for this may lie in the fact that due to the intimate contact with the back of the target surface and due to the contact of the carbon film with the membrane, an outgassing of the glue is radically slowed, and is thus not relevant.

The invention will now be explained in detail with the aid of the drawings and in conjunction with different exemplary embodiments.

BRIEF DESCRIPTION OF THE DRAWINGS

FIG. 3 shows the limited thermal contact in a coating source with cooling according to FIG. 2.

FIG. 4 shows a cross-section through an embodiment of the target according to the invention with an attached self-adhesive carbon film.

DETAILED DESCRIPTION OF THE PREFERRED EMBODIMENTS

Figure 1:
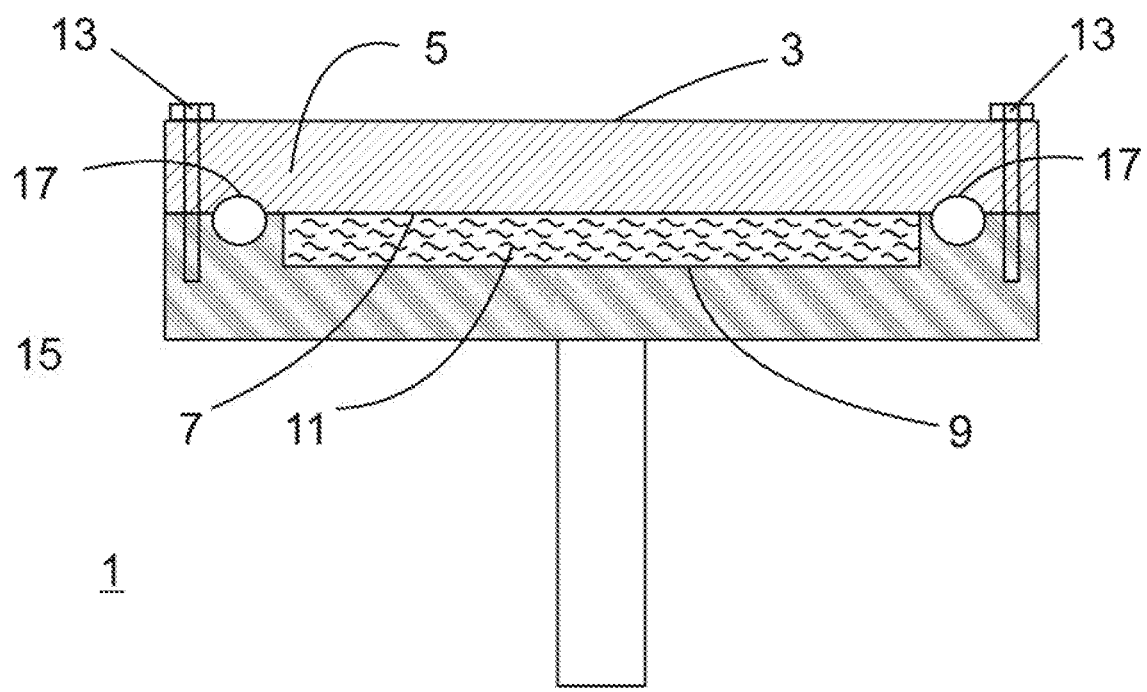
FIG. 1 shows a conventional coating source with direct cooling.
Figure 2:
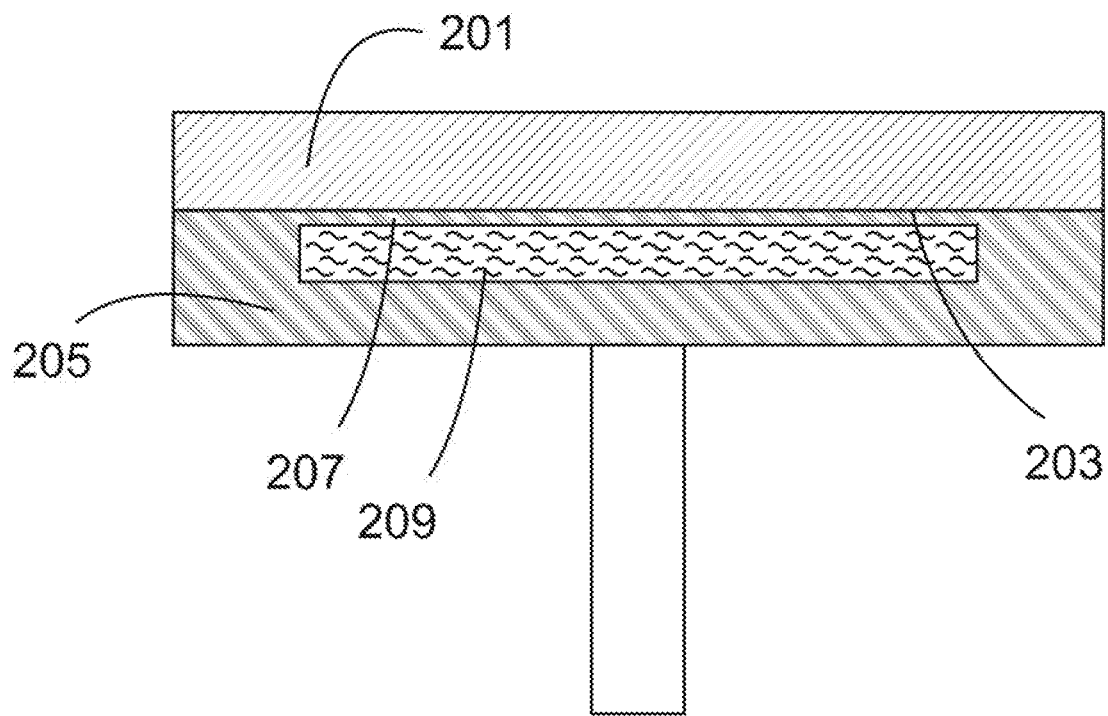
FIG. 2 shows a conventional coating source with indirect cooling.

FIG. 4a correspondingly shows a target 401, whose target back 403 has a carbon film 407 mounted to it that is self-adhesive on one side and has a thickness of between 0.1 mm and less than 0.5 mm. The thickness of the carbon film that is preferable and has been selected, in the example is 0.125 mm. In the example, a contact film from the Kunze company with the product identification number KU-CB1205-AV was used.

FIG. 4 shows a more enlarged detail of the boundary surface between the target back and the self-adhesive carbon film. The carbon film here includes an adhesive film 409, which transforms the carbon film into a self-adhesive film, and a carbon film 411.

Figure 5:
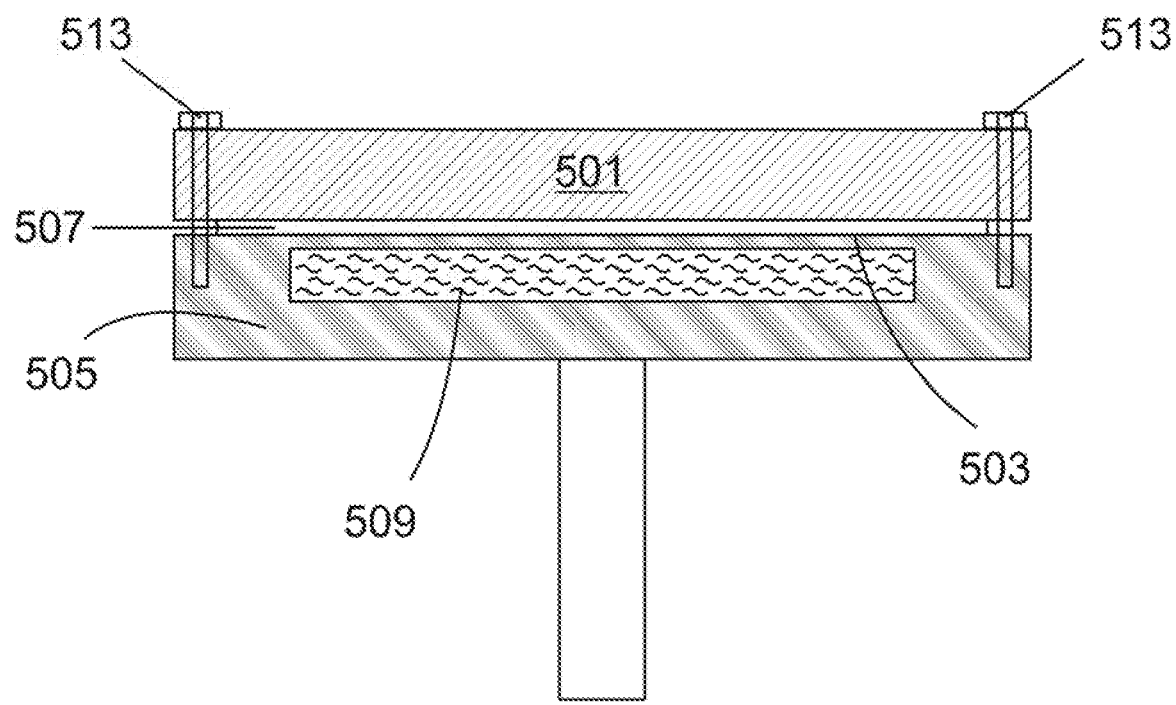
FIG. 5 shows the target according to the invention, integrated into a coating source with indirect cooling in a first embodiment.

The target according to FIG. 4 can easily be integrated into a coating source with indirect cooling, as shown in FIG. 5: The target 501 with the self-adhesive carbon film 507 is fastened with the screws 513 to the front of a source holder 505; a cooling plate with a cooling duct 509 is integrated into the source holder and the carbon film 507 is pressed against the back 503 of the cooling plate, producing a good thermal contact with the cooling plate. Because of the fact that according to the invention, the carbon film is glued to the target back, it is very easy to change the target, even if the target is mounted vertically in a coating chamber.

Figure 6:
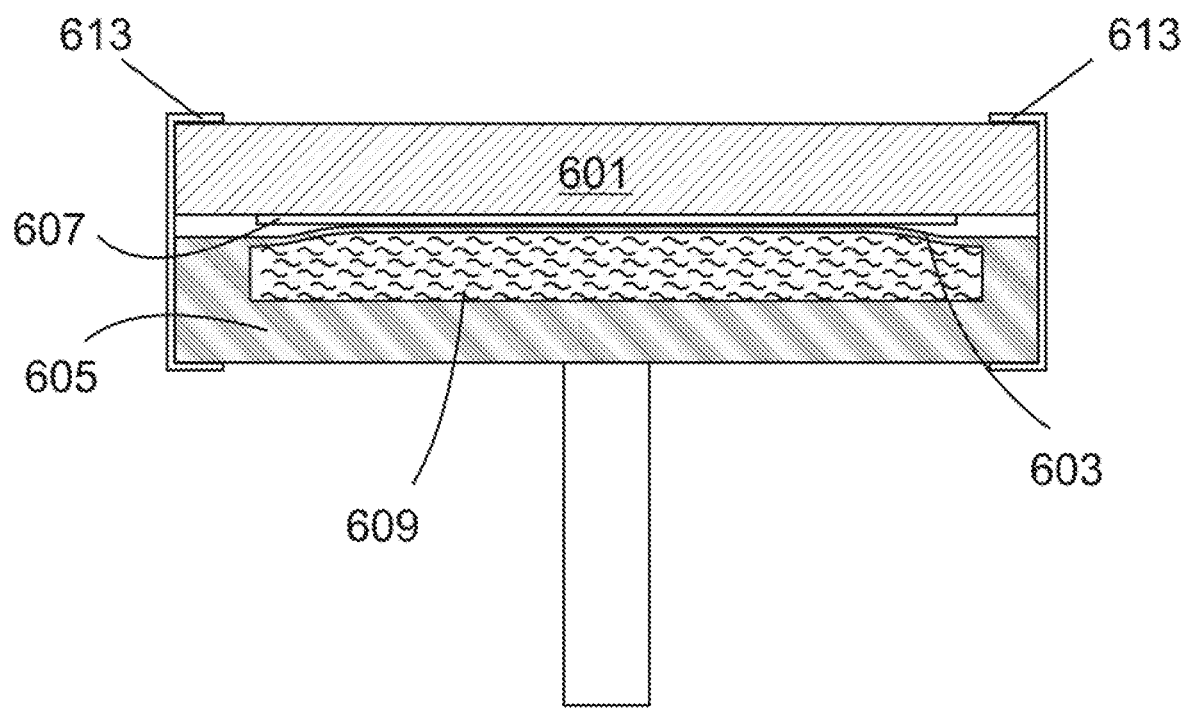
FIG. 6 shows the target according to the invention, integrated into a coating source in a second embodiment.

An improved variant of indirect cooling is indirect cooling by means of a moving membrane, as shown in FIG. 6. The design is similar to the one shown in FIG. 5, having a target 601 with a self-adhesive carbon film 607, a source holder 605, and a cooling duct 609, but in this preferred embodiment, the wall of the cooling, plate that separates the cooling duct 609 from the carbon film 607 is embodied as a flexible membrane 603. The coolant can, for example, be water. In a target change, it is not necessary to remove a water seal. If the target 601 is fastened to the source holder 605 by suitable means by means of clamps 613 or screws), then the hydrostatic pressure prevailing in the cooling duct 609 presses the membrane 603 uniformly against the target back and thus against the self-adhesive carbon film 607, producing a good, extensive thermal contact.

The fact that in this case, the self-adhesive carbon film plays a significant role is documented in impressive fashion in Table 1 below, which compares the target temperature with and without the self-adhesive carbon film for different sputtering powers and two different material compositions:

TABLE 1

| No. | Target type | Carbon film | Sputtering power | Target temperature |
|---|---|---|---|---|
| 1 | AlCr (70:30 at %) | No | 5 KW | 235° C. |
| 2 | AlCr (70:30 at %) | Yes | 5 KW | 132° C. |
| 3 | AlCr (70:30 at %) | Yes | 7.5 KW | 171° C. |
| 4 | AlCr (70:30 at %) | Yes | 10 KW | 193° C. |
| 5 | AlTi (67:33 at %) | Yes | 5 KW | 138° C. |
| 6 | AlTi (67:33 at %) | Yes | 7.5 KW | 182° C. |

A target without the self-adhesive carbon film according to the invention as in measurement no. 1 of Table 1 can only be safely operated up to a sputtering power of 2.5 kW for mechanical reasons. By using a target according to the invention with a self-adhesive carbon film, the power compatibility is more than doubled.

Different target materials, i.e. with other AlTi or AlCr ratios and also with pure aluminum titanium and/or chromium targets, produce a similar quality picture. The present invention demonstrates a particularly good effect when target thicknesses of between 6 mm and 18 mm are used. Preferably, the target thickness is between 6 mm and 12 mm.

Figure 7:
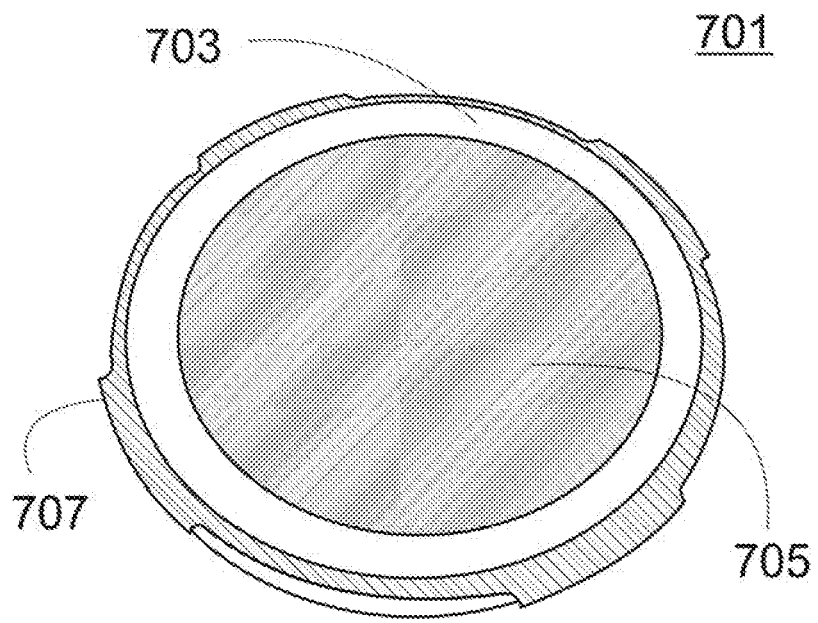
FIG. 7 shows the target according to the invention, integrated into a coating source in a third embodiment.

According to a particularly preferable embodiment of the present invention, the target 701 is embodied in the form of a target with self-adhesive carbon film 705 on the target back 703 and a bayonet profile 707 according to FIG. 7. A preferred coating source according to this embodiment has the indirect cooling shown in FIG. 6, with a membrane and counterpart elements for the bayonet attachment. This enables the production of a high, homogeneous contact pressure. This preferred embodiment is particularly advantageous in connection with powder metallurgy targets because they can mechanically weaken above a temperature of 150° C. and the thermal expansion increases. This thermal stress is significantly reduced by reducing the target temperature and the mechanical clearance provided by the bayonet attachment. For chromium targets, for example power densities of up to 100 W/cm$^2$ are possible.

A target is disclosed, which is embodied as a material source used for a depositing process from the gas phase, having a front and a back, which is characterized, in that a self-adhesive carbon film is glued to the back.

The target can be embodied as a material source for a sputtering process and/or for an arc vaporization process. The self-adhesive carbon film can, for example, have a thickness of between 0.125 mm and 0.5 mm and preferably, a thickness of 0.125 mm.

A coating source is disclosed, including a target of the above-described type, which is positioned on a source holder, into which an indirect cooling with a cooling duct is integrated.

In the coating source, preferably the wall that separates the cooling duct from the self-adhesive carbon film is embodied in the form of a flexible membrane, by means of which the self-adhesive carbon film produces an extensive contact with the membrane.

The circumference of the target of the coating source is preferably embodied so that it cooperates with the source holder in the form of a bayonet attachment, thus producing a higher and more homogeneous contact pressure.

In an indirectly cooled coating source, it would also be possible to glue the self-adhesive carbon film to the wall that separates the cooling duct from the back of a target. This is possible even if the wall is embodied as a membrane. This has the disadvantage, however, that if the film is damaged, it must be removed from the source holder, which is labor-intensive, and subsequently replaced. If the self-adhesive carbon film is thin enough, it is also possible to attach it both to the target back and to the wall that separates the cooling duct from the back of the target.

According to another embodiment of the present invention, an additional plate with a high thermal conductivity is provided between the target and the component that includes a cooling duct for carrying off heat. This plate can, for example, be a molybdenum plate or a copper plate. The additional plate can be in detachable contact with the component that contains the cooling duct. Once again, it is important that a very good, extensive thermal contact is provided. According to the invention, on the side in which the additional plate is provided, a self-adhesive carbon film can be provided. In this case, it is advantageous if a self-adhesive carbon film is also provided on the target back, as described above. Preferably, the plate that is embodied in this way is provided with a self-adhesive carbon film on both sides. This provides both a good, extensive thermal contact on the target side and a good thermal contact with the component that contains the cooling duct. The additional plate embodied in this way is thus covered with self-adhesive carbon film on both sides. This additional plate can easily be selected to be thick enough that it has sufficient stability so that no problems are caused by the handling that is necessary when changing the target. This embodiment also has the advantage that no expensive components such as the cooling duct component or the target have to have the film glued to them. At least if copper is used for the additional plate, this is a very inexpensive variant. If one of the two self-adhesive carbon films is damaged, then it is not expensive to replace this additional plate.

Figure 8:
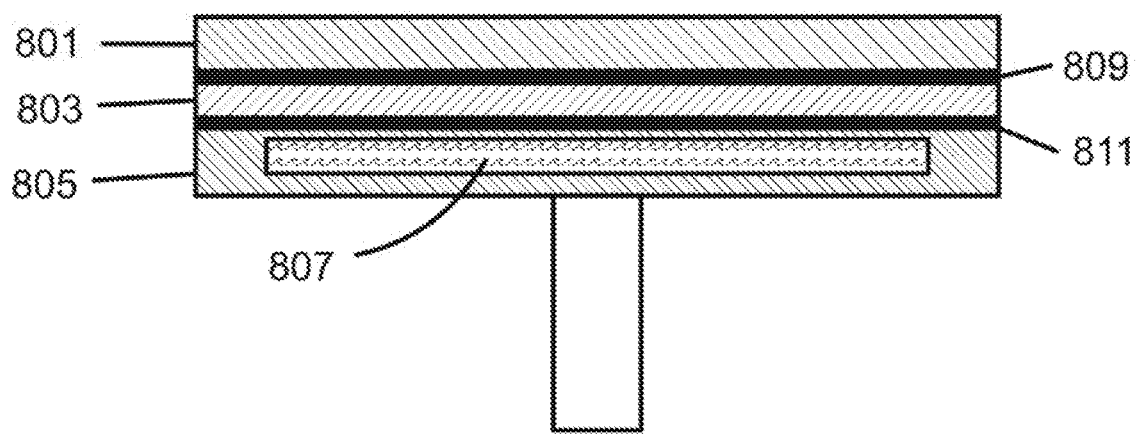
FIG. 8 shows the target according to the invention, integrated into a coating source in a fourth embodiment.

FIG. 8 schematically depicts the corresponding design of this embodiment. The thawing shows the component 805 with the cooling duct 807 by means of which the heat is finally carried off. Resting on it is the additional thermally conductive plate 803, whose one side is provided with a first self-adhesive carbon film 811 and whose other side is provided with a second self-adhesive carbon film 809 on which, in turn, is placed the target 801.

The invention claimed is:

1. A device for cooling a target, comprising:
a component that includes a cooling duct; and
an additional thermally conductive plate positioned between the component and the target, wherein the additional thermally conductive plate is at least 3 millimeters thick and is detachably fastened to a cooling side of the component, the cooling side being the side on which the cooling duct exerts its cooling action, and between the additional thermally conductive plate and the cooling side of the component, a first self-adhesive carbon film that is self-adhesive on one side of the first self-adhesive carbon film is provided, which is extensively and self-adhesively attached to a side of the additional thermally conductive plate that faces the cooling side, and on a side of the additional thermally conductive plate opposite the side that faces the cooling side of the component, a second self-adhesive carbon film that is self-adhesive on one side of the second self-adhesive carbon film is extensively and self-adhesively attached to the additional thermally conductive plate, wherein the first self-adhesive carbon film is not glued to the cooling side of the component and the second self-adhesive carbon film is not glued to the target, and each of the first and second self-adhesive carbon films has a thickness of between 0.125 mm and less than 0.5 mm.

2. The device according to claim 1, wherein the additional thermally conductive plate contains copper.

3. A target with a cooling device according to claim 1, wherein the target is embodied as a material source for a sputtering process and/or for an arc vaporization process.

4. A coating source that includes a target with a device according to claim 1.

5. The coating source according to claim 4, wherein a circumference of the target cooperates with a source holder in the form of a bayonet attachment, which produces a high, homogeneous contact pressure.

6. The device according to claim 1, wherein the target has a thickness between 6 millimeters and 18 millimeters.

7. The device according to claim 1, wherein the additional thermally conductive plate consists essentially of copper.

8. The device according to claim 1, wherein the additional thermally conductive plate contains molybdenum.

9. The device according to claim 1, wherein the additional thermally conductive plate consists essentially of molybdenum.

* * * * *